(12) United States Patent
Liao et al.

(10) Patent No.: US 10,910,329 B2
(45) Date of Patent: Feb. 2, 2021

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Kuo-Hsien Liao, Kaohsiung (TW); Alex Chi-Hong Chan, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 372 days.

(21) Appl. No.: 15/603,314

(22) Filed: May 23, 2017

(65) Prior Publication Data

US 2018/0342470 A1 Nov. 29, 2018

(51) Int. Cl.
*H01Q 13/24* (2006.01)
*H01L 23/66* (2006.01)
(Continued)

(52) U.S. Cl.
CPC ............ *H01L 23/66* (2013.01); *H01L 23/552* (2013.01); *H01P 3/121* (2013.01); *H01P 5/107* (2013.01); *H01Q 1/2283* (2013.01); *H01Q 1/526* (2013.01); *H01L 23/49805* (2013.01); *H01L 23/5383* (2013.01); *H01L 23/5386* (2013.01); *H01L 2223/665* (2013.01); *H01L 2223/6627* (2013.01); *H01L 2223/6677* (2013.01); *H01L 2224/16225* (2013.01); *H01L 2224/97* (2013.01); *H01L 2924/15192* (2013.01); *H01L 2924/181* (2013.01); *H01L 2924/19105* (2013.01)

(58) Field of Classification Search
CPC . H01L 23/66; H01L 23/552; H01L 23/49805; H01L 2223/665; H01L 23/6677; H01L 23/6627; H01L 2224/97; H01L 2924/19105; H01L 2924/15192; H01L 25/00; H01L 27/00; H01P 3/121; H01P 5/107; H01Q 1/2283; H01Q 1/526; H01Q 13/24; G02F 1/00; G01S 7/00
USPC .................................................. 333/26, 248
See application file for complete search history.

(56) References Cited

U.S. PATENT DOCUMENTS 8,058,714 B2 11/2011 Noll et al.
9,153,542 B2 10/2015 Lin et al.
(Continued)

FOREIGN PATENT DOCUMENTS

CN 103151340 A 6/2013
CN 105590902 A 5/2016

*Primary Examiner* — Dimary S Lopez Cruz
*Assistant Examiner* — Awat M Salih
(74) *Attorney, Agent, or Firm* — Foley & Lardner LLP

(57) ABSTRACT

The disclosure relates to a semiconductor package device. The semiconductor package device includes a substrate, a waveguide component, a package body, a first dielectric layer, an antenna pattern, and an antenna feeding layer. The waveguide component is on the substrate. The package body is on the substrate and encapsulates the waveguide component. The first dielectric layer is on the package body and has a first surface and a second surface adjacent to the package body and opposite to the first surface. The antenna pattern is on the first surface of the first dielectric layer. The antenna feeding layer is on the second surface of the first dielectric layer.

19 Claims, 15 Drawing Sheets

(51) Int. Cl.
  *H01L 23/552*  (2006.01)
  *H01Q 1/52*   (2006.01)
  *H01Q 1/22*   (2006.01)
  *H01P 3/12*   (2006.01)
  *H01P 5/107*  (2006.01)
  H01L 23/538   (2006.01)
  H01L 23/498   (2006.01)

(56) References Cited

U.S. PATENT DOCUMENTS

| | | |
|---|---|---|
| 9,337,159 B2 | 5/2016 | Seler et al. |
| 2010/0190464 A1* | 7/2010 | Chen ........................ H01L 23/04 |
| | | 455/334 |
| 2014/0145884 A1* | 5/2014 | Dang .................... H01Q 1/2283 |
| | | 343/700 MS |
| 2016/0276288 A1* | 9/2016 | Lee ........................ H01L 23/552 |
| 2017/0170127 A1* | 6/2017 | Choi ...................... H01L 23/544 |
| 2018/0159203 A1* | 6/2018 | Baks ...................... H01Q 9/0407 |
| 2018/0205134 A1* | 7/2018 | Khan ....................... H01Q 11/08 |

\* cited by examiner

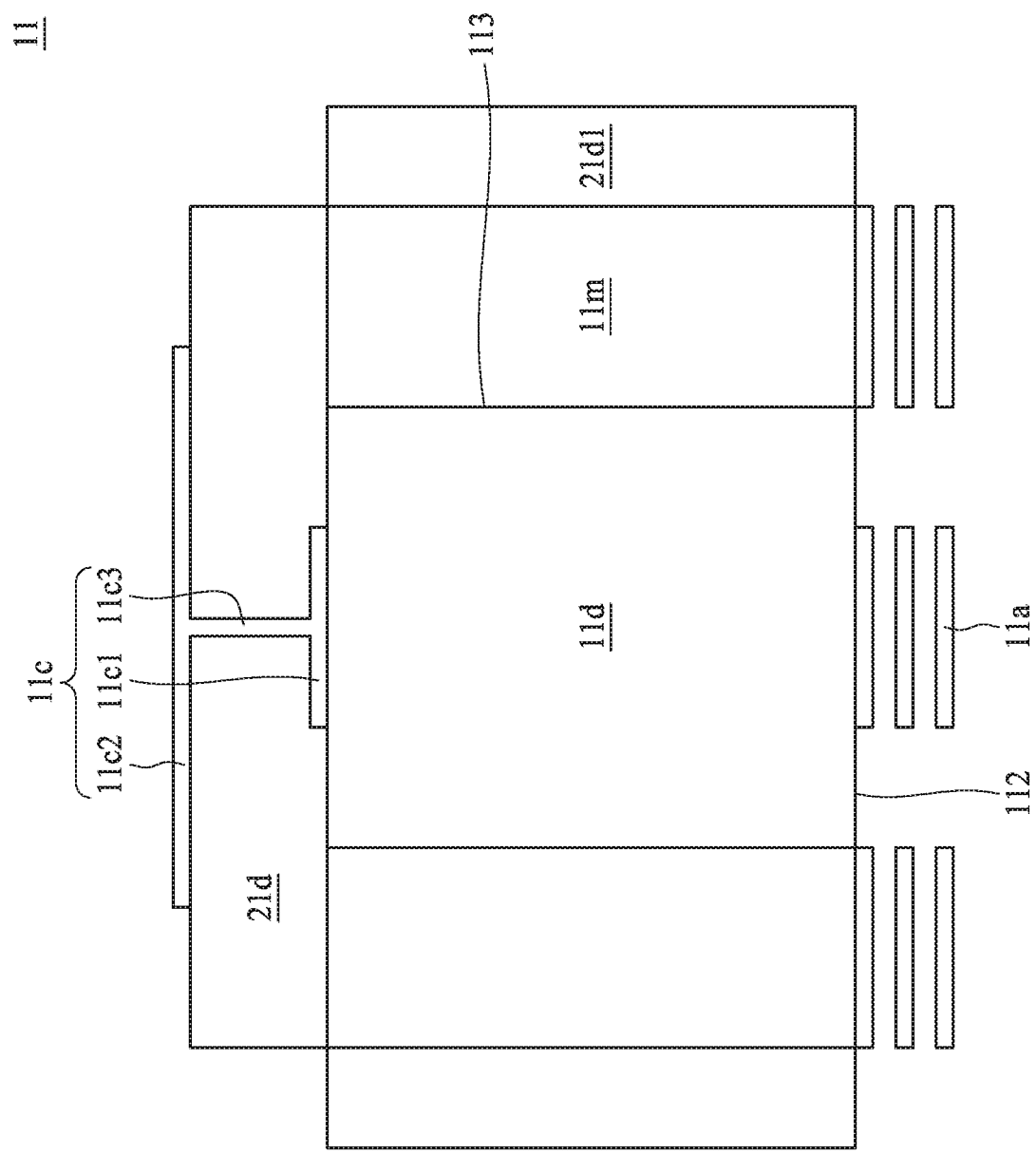

SEMICONDUCTOR PACKAGE DEVICE AND METHOD OF MANUFACTURING THE SAME

BACKGROUND

1. Technical Field

The present disclosure relates to a semiconductor package device and a method of manufacturing the same, and more particularly, to a semiconductor package device including a pattern and a method of manufacturing the same.

2. Description of the Related Art

Wireless communication devices, such as cell phones, typically include antennas for transmitting and receiving radio frequency (RF) signals. Comparably, a wireless communication device includes an antenna and a communication module, each disposed on different parts of a circuit board. Under the comparable approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. In addition, an RF signal transmission path between the antenna and the communication module may be long, thereby reducing quality of a signal transmitted between the antenna and the communication module.

SUMMARY

In accordance with some embodiments of the present disclosure, a semiconductor package device includes a substrate, a waveguide component, a package body, a dielectric layer, an antenna pattern, and an antenna feeding layer. The waveguide component is on the substrate and includes a coupling element. The package body is on the substrate and encapsulates the waveguide component. The dielectric layer is on the package body and has a first surface and a second surface adjacent to the package body and opposite to the first surface. The antenna pattern is on the first surface of the dielectric layer. The antenna feeding layer is on the second surface of the dielectric layer.

In accordance with some embodiments of the present disclosure, a waveguide component includes a first dielectric block, a first conductive contact, a coupling element, and a metal plate. The first dielectric block has a top surface, a bottom surface opposite to the top surface and a lateral surface extending between the top surface and the bottom surface. The first conductive contact is on the bottom surface of the first dielectric block. The coupling element is on the top surface of the first dielectric block and opposite to the first conductive contact. The metal plate surrounds the lateral surface of the first dielectric block.

BRIEF DESCRIPTION OF THE DRAWINGS

FIG. 1D illustrates a cross-sectional view of a waveguide component in accordance with some embodiments of the present disclosure.

Figure 1A:
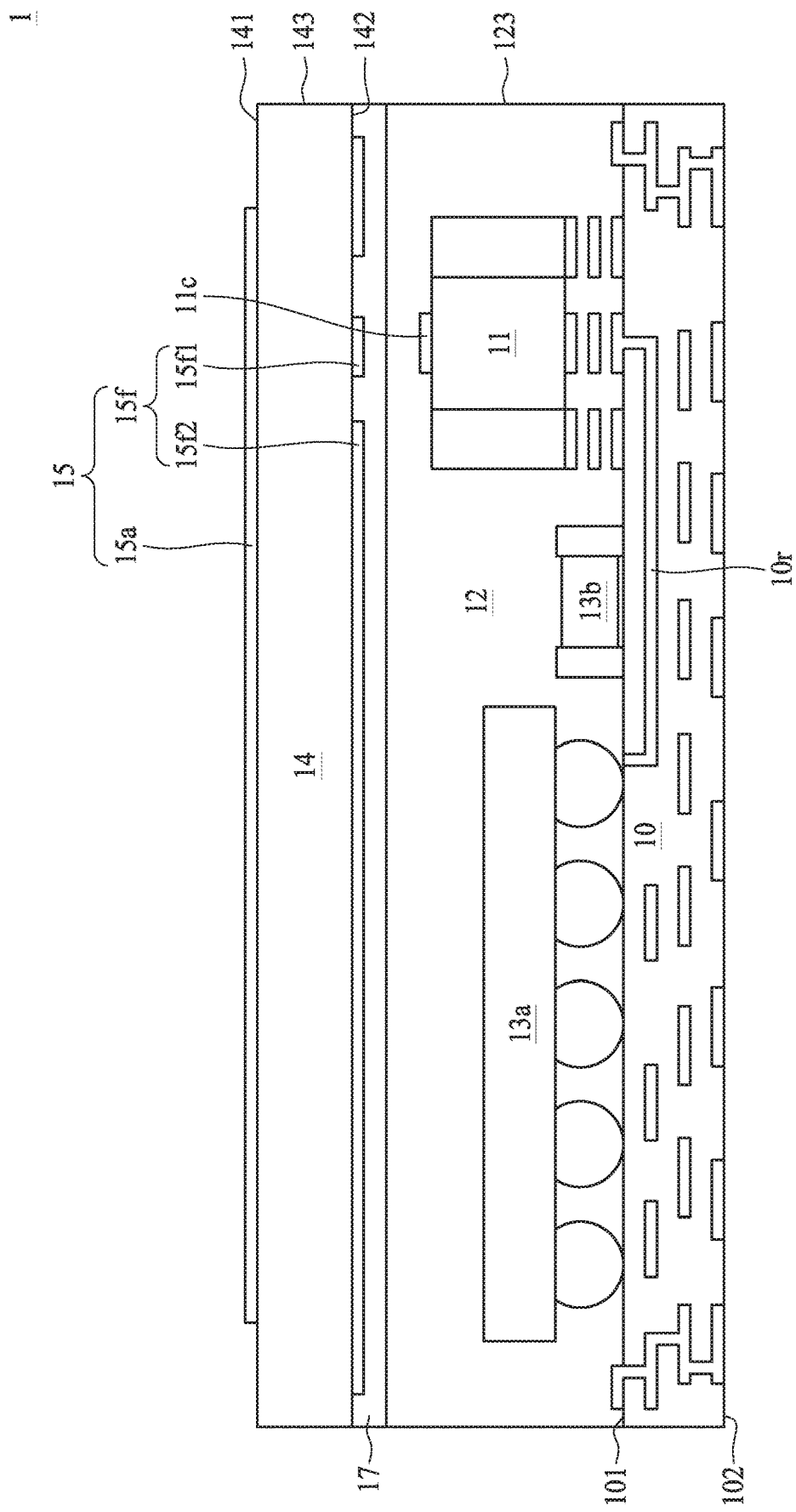
FIG. 1A illustrates a cross-sectional view of a semiconductor package device in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

FIG. 1A illustrates a cross-sectional view of a semiconductor package device 1 in accordance with some embodiments of the present disclosure. The semiconductor package device 1 includes a substrate 10, a waveguide component 11, a package body 12, electronic components 13a, 13b, a dielectric layer (e.g., a first dielectric layer) 14, an antenna 15 and an adhesive layer 17.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure (or electrical connection) 10r, such as a redistribution layer (RDL) or a grounding element. In some embodiments, the grounding element is a via exposed from a lateral surface of the substrate 10. In some embodiments, the grounding element is a metal layer exposed from the lateral surface of the substrate 10. In some embodiments, the grounding element is a metal trace exposed from the lateral surface of the substrate 10. The substrate 10 may include opposite surfaces 101 and 102. In some embodiments, the surface 101 of the substrate 10 is referred to as a top surface or a first surface and the surface 102 of the substrate 10 is referred to as a bottom surface or a second surface.

The electronic components 13a, 13b are disposed on the surface 101 of the substrate 10. The electronic component 13a may be an active electronic component, such as an integrated circuit (IC) chip or a die. The electronic component 13b may be a passive electronic component, such as a capacitor, a resistor or an inductor. Each electronic component 13a, 13b may be electrically connected to one or more other electronic components and to the substrate 10 (e.g., to the RDL), and electrical connection may be attained by way of flip-chip or wire-bond techniques.

The waveguide component 11 is disposed on the surface 101 of the substrate 10. The waveguide component 11 is electrically connected to the electronic component 13a through the interconnection structure 10r to receive signals from the electronic component 13a or to transmit signals to the electronic component 13a.

Figure 1B:
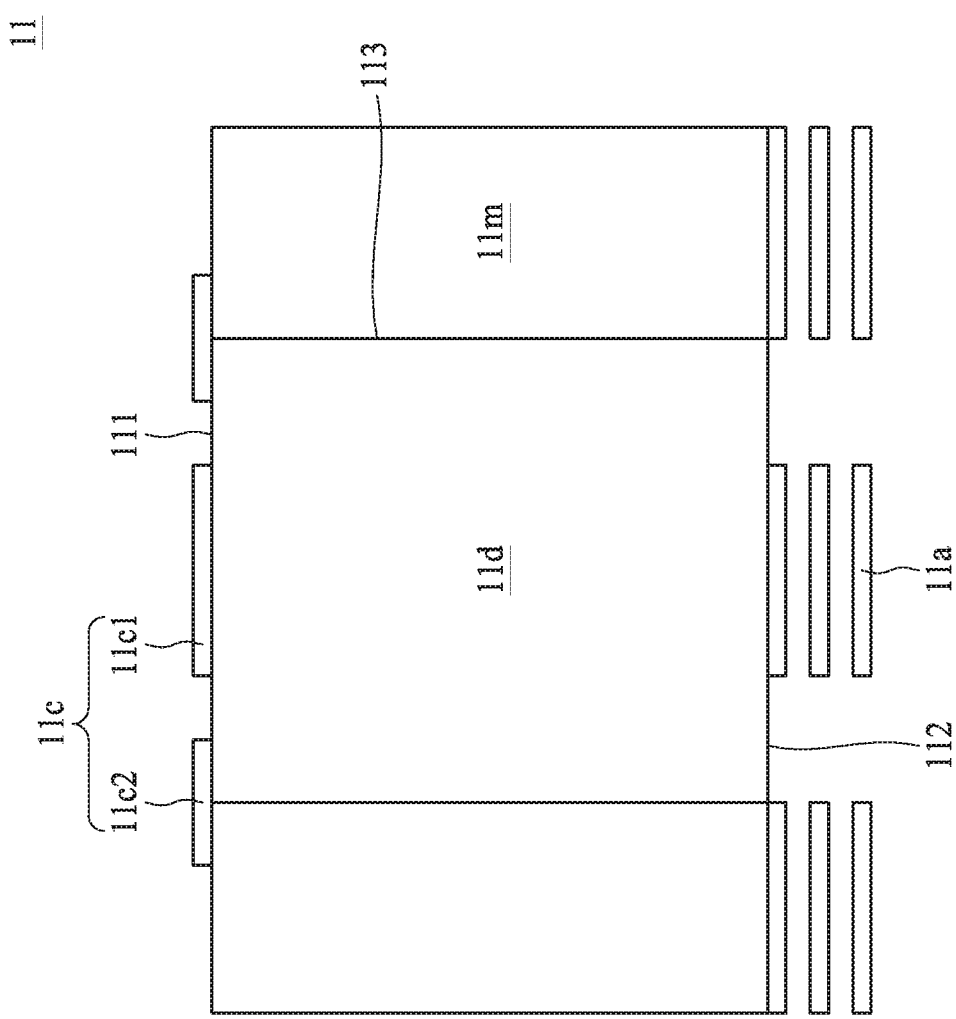
FIG. 1B illustrates a cross-sectional view of a waveguide component in accordance with some embodiments of the present disclosure.

As shown in FIG. 1B, the waveguide component 11 includes a dielectric block 11d, a conductive contact 11a, a coupling element 11c and a metal plate 11m. The dielectric block 11d has a top surface 111, a bottom surface 112 opposite to the top surface 111 and a lateral surface 113 extending between the top surface 111 and the bottom surface 112.

The conductive contact 11a is disposed on the bottom surface 112 of the dielectric block 11d and is electrically connected to the electronic component 13a through the interconnection structure 10r. In some embodiments, the electronic component 13a is electrically connected to the conductive contact 11a of the waveguide component through a trace on the substrate 10 passing through an opening of the metal plate 11m.

The metal plate 11m surrounds the lateral surface 113 of the dielectric block 11d. In some embodiments, the refractive index of the metal plate 11m is less than that of the dielectric block 11d, and thus when an electromagnetic wave is transmitted within the waveguide component 11, a total internal reflection occurs at a boundary between the dielectric block 11d and the metal plate 11m. Therefore, the electromagnetic wave can be transmitted within the waveguide component 11 without attenuation.

Figure 1C:
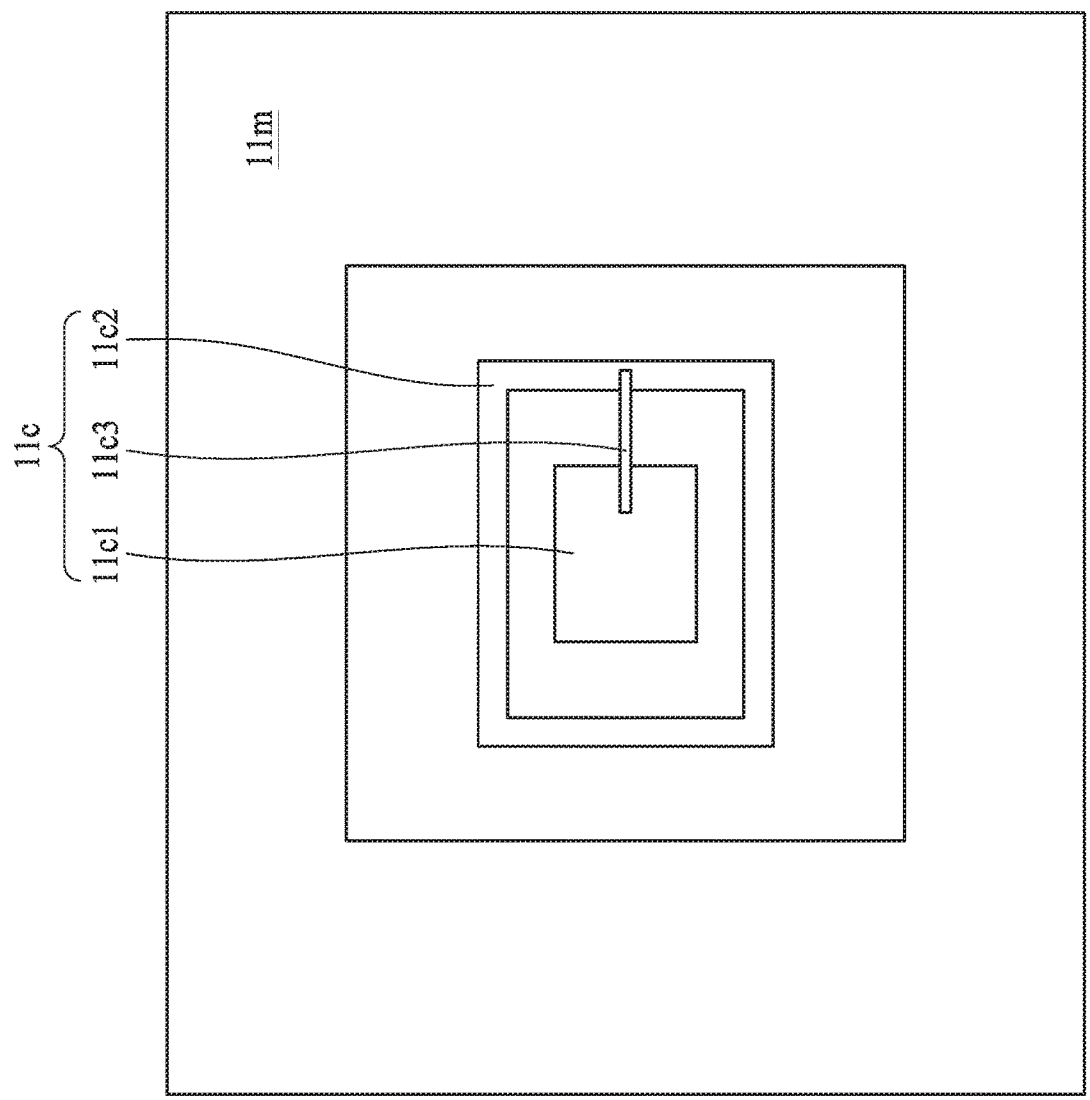
FIG. 1C illustrates a top view of a waveguide component in accordance with some embodiments of the present disclosure.

The coupling element 11c is disposed on the top surface 111 of the dielectric block 11d. As shown in FIG. 1C, which illustrates a top view of the waveguide component 11, the coupling element 11c includes a conductive contact 11c1, a coupling pattern 11c2 and a conductive line 11c3 electrically connecting the conductive contact 11c1 to the coupling pattern 11c2. The conductive contact 11c1 is disposed at a location of the top surface 111 of the dielectric block 11d corresponding to or aligned with a location of the conductive contact 11a. The conductive contact 11c1 is arranged to transmit signals to the conductive contact 11a or to receive signals from the conductive contact 11a. The coupling pattern 11c2 is disposed on the top surface 111 of the dielectric block 11d and adjacent to the conductive contact 11c1. The coupling pattern 11c2 is electrically connected to the conductive contact 11c1 through the conductive line 11c3. The coupling pattern 11c2 is coupled to a feeding layer (e.g., an antenna feeding layer) 15f (including a first portion 15f1 and a second portion 15f2) of the antenna 15 to transmit signals to the antenna 15 or to receive signals from the antenna 15. In some embodiments, the coupling pattern 11c2 is shaped as a square, a circle, a spiral or any other suitable shape depending on design specifications.

In some embodiments, the coupling pattern 11c2 and the conductive contact 11c1 are located at or along a same plane (e.g., the coupling pattern 11c2 and the conductive contact 11c1 are substantially coplanar). In other embodiments, the coupling pattern 11c2 and the conductive contact 11c1 are located at or along different planes (e.g., the coupling pattern 11c2 and the conductive contact 11c1 are not coplanar).

As shown in FIG. 1D, in some embodiments, a waveguide component 11' includes an additional dielectric block 21d disposed on the metal plate 11m and the dielectric block 11d. A conductive contact 11a is disposed on the dielectric block 11d and a coupling pattern 11c2' is disposed on the dielectric block 21d. The conductive contact 11c1' is electrically connected to the coupling pattern 11c2' through a conductive line 11c3'. In some embodiments, the conductive line 11c3' is a through via. In some embodiments, the waveguide component 11' may include a dielectric layer (e.g., a second dielectric layer) 21d1 surrounding the metal plate 11m.

Referring back to FIG. 1A, the package body 12 is disposed on the surface 101 of the substrate 10 and encapsulates the waveguide component 11 and the electronic components 13a, 13b. In some embodiments, the package body 12 includes an epoxy resin including fillers, a molding compound (e.g., an epoxy molding compound or other molding compound), a polyimide, a phenolic compound or material, a material including a silicone dispersed therein, or a combination thereof.

The dielectric layer 14 is disposed on the package body 12. In some embodiments, the dielectric layer 14 is attached to the package body 12 through the adhesive layer 17. The dielectric layer 14 may include, but is not limited to, molding compounds or pre-impregnated composite fibers (e.g., pre-preg). Examples of molding compounds may include, but are not limited to, an epoxy resin including fillers dispersed therein. Examples of a pre-preg may include, but are not limited to, a multi-layer structure formed by stacking or laminating a number (or plurality) of pre-impregnated materials and/or sheets.

The antenna 15 includes an antenna pattern 15a on a top surface 141 of the dielectric layer 14 and the feeding layer 15f on a bottom surface 142 of the dielectric layer 14. The antenna 15 is, or includes, a conductive material such as a metal or metal alloy. Examples of the conductive material include gold (Au), silver (Ag), aluminum (Al), copper (Cu), or an alloy thereof.

The feeding layer 15f of the antenna 15 includes the first portion 15f1 and the second portion 15f2. The first portion 15f1 is disposed at a location of the bottom surface 142 of the dielectric layer 14 corresponding to or aligned with a location of the coupling element 11c of the waveguide component 11. The first portion 15f1 of the feeding layer 15f is arranged to transmit signals to the coupling element 11c of the waveguide component 11 or to receive signals from the coupling element 11c of the waveguide component 11. Signals are transmitted between the feeding layer 15f and the antenna pattern 15a by coupling (e.g., the first portion 15f1 is physically isolated or spaced from the antenna pattern 15a, but is electrically and wirelessly coupled to the antenna pattern 15a).

In some comparable semiconductor package devices integrated with an antenna, the antenna and electronic components are disposed on the substrate side by side, which would increase the total area (e.g., the X-Y dimension) of the semiconductor package device. In accordance with some embodiments, the antenna 15 is disposed on the package body 12, and thus the total area of the semiconductor package device 1 can be reduced. In addition, by placing the antenna 15 on the package body 12, the antenna 15 is closer to the electronic component 13a. Reducing the distance between the antenna 15 and the electronic component 13a can reduce signal loss during transmission, which would in turn increase the performance of the semiconductor package device 1.

In some embodiments, the antenna 15 can be connected to a conductive pad on the surface 101 of the substrate 10 by a through metal via (TMV) rather than the waveguide component 11. However, in general, a thickness of the package body 12 is in a range from about 0.7 millimeter (mm) to about 2 mm. Due to the limitation of the aspect ratio (e.g., a ratio between a width and a depth) of the TMV, it is difficult to form the TMV within the package body with such thickness, and the failure rate would increase. By using the waveguide component 11 (e.g., the coupling element 11c) to transmit signal between the waveguide component 11 and the antenna 15 via coupling, it is unnecessary to use the TMV, which would simplify the manufacturing process and increase the yield rate for manufacturing the semiconductor package device 1.

In some embodiments, a metal plate can be disposed on the top surface 101 of the substrate 10, and thus the signal can be transmitted between the metal plate and the antenna 15 by coupling. However, an extremely large area of the substrate 10 for the metal plate is used to transmit signals to or receive signals from the antenna 15. Using the waveguide component 11 for coupling the signal between the antenna 15 and the waveguide component 11 can reduce the area of the substrate 10 and signal loss during transmission.

Figure 2:
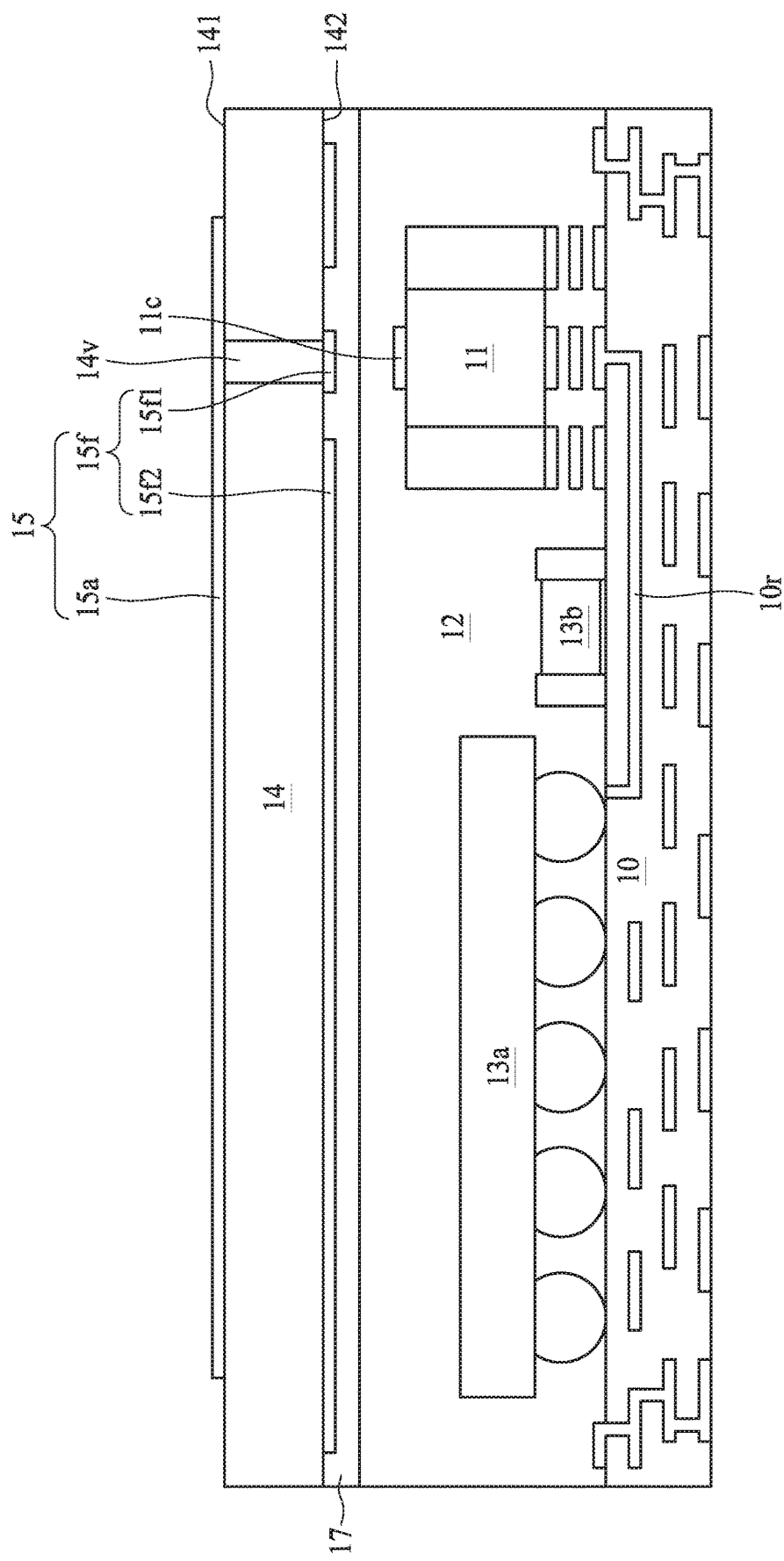
FIG. 2 illustrates a cross-sectional view of a semiconductor package device in accordance with some embodiments of the present disclosure.

FIG. 2 illustrates a cross-sectional view of a semiconductor package device 2 in accordance with some embodiments of the present disclosure. The semiconductor package device 2 is similar to the semiconductor package device 1 shown in FIG. 1A except that the feeding layer 15f is connected to the antenna pattern 15a by a through via (e.g., electrical connection) 14v.

The through via 14v penetrates the dielectric layer 14 to electrically connect the antenna pattern 15a to the portion 15f1 of the feeding layer 15f. Therefore, signals can be transmitted between the antenna pattern 15a and the feeding layer 15f by the through via 14v rather than via coupling as shown in FIG. 1A.

Figure 3:
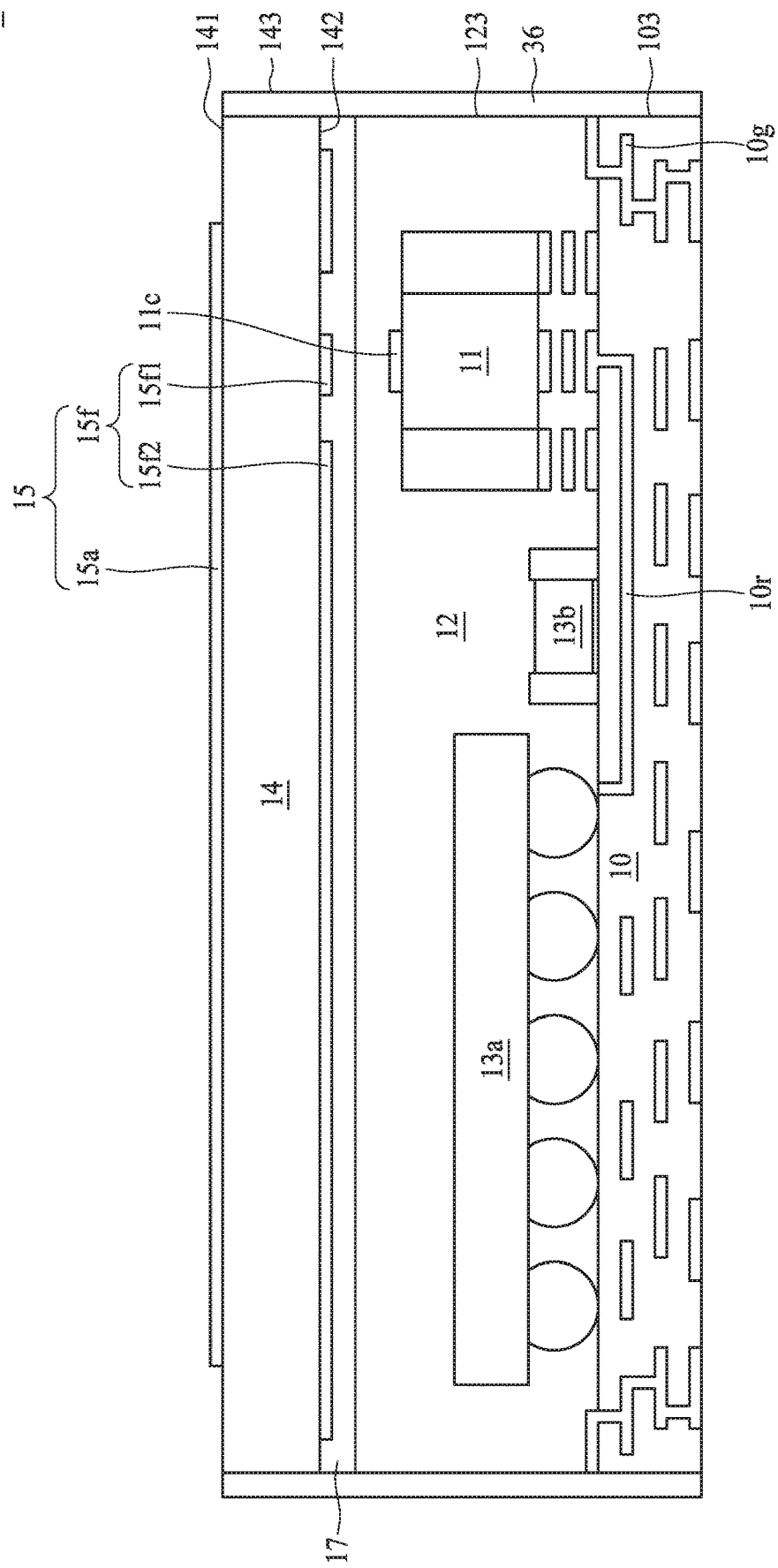
FIG. 3 illustrates a cross-sectional view of a semiconductor package device in accordance with some embodiments of the present disclosure.

FIG. 3 illustrates a cross-sectional view of a semiconductor package device 3 in accordance with some embodiments of the present disclosure. The semiconductor package device 3 is similar to the semiconductor package device 1 shown in FIG. 1A except that the semiconductor package device 3 further includes a shielding layer 36.

The shielding layer 36 is disposed on a lateral surface 103 of the substrate 10, a lateral surface 123 of the package body 12 and a lateral surface 143 of the dielectric layer 14. The shielding layer 36 is electrically connected to a grounding element 10g of the substrate 10. In some embodiments, the shielding layer 36 directly contacts the grounding element 10g of the substrate 10. The shielding layer 36 is aligned with the bottom surface 102 of the substrate 10; for example, a bottom of the shielding layer 36 is substantially coplanar with the bottom surface 102 of the substrate 10. In some embodiments, the shielding layer 36 is a conductive thin film, and may include, for example, Al, Cu, chromium (Cr), tin (Sn), Au, Ag, nickel (Ni) or stainless steel, or a mixture, an alloy, or other combination thereof. The shielding layer 36 may include a single conductive layer or multiple conductive layers. In some embodiments, the shielding layer 36 includes multiple (or a plurality of) conductive layers, and the multiple conductive layers may include a same material, or ones of the multiple conductive layers may include different materials, or each of the multiple conductive layers may include different materials from others of the multiple conductive layers. In some embodiments, each conductive layer of the shielding layer 36 has a thickness of up to about 200 micrometers (μm), such as up to about 150 μm, up to about 100 μm, up to about 50 μm, up to about 10 μm, up to about 5 μm, up to about 1 μm, or up to about 500 nanometers (nm), and down to about 100 nm or less, down to about 50 nm or less, or down to about 10 nm or less. In some embodiments, the shielding layer 36 includes multiple conductive layers, and different conductive layers may have different thicknesses.

Figure 4:
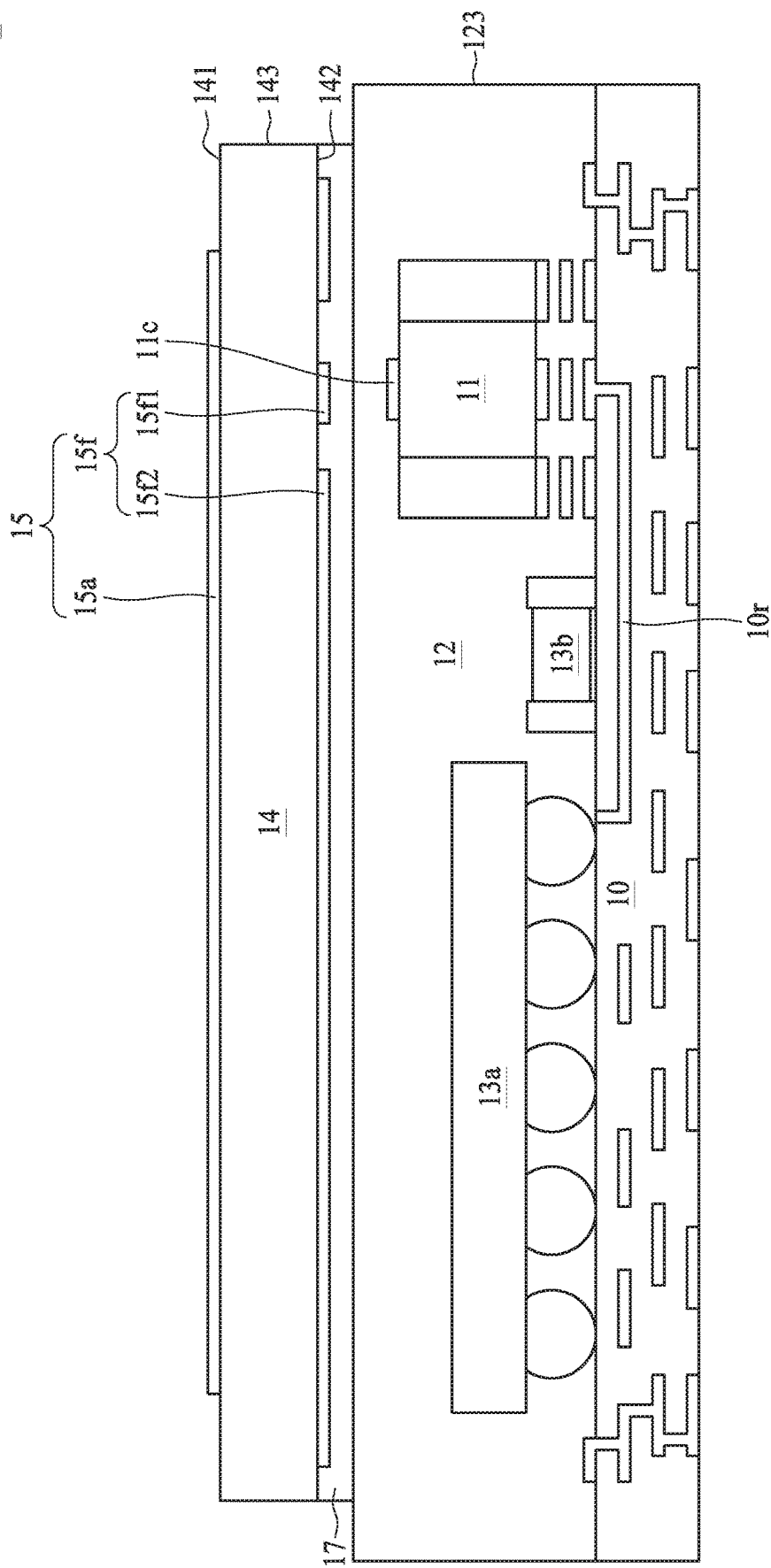
FIG. 4 illustrates a cross-sectional view of a semiconductor package device in accordance with some embodiments of the present disclosure.

FIG. 4 illustrates a cross-sectional view of a semiconductor package device 4 in accordance with some embodiments of the present disclosure. The semiconductor package device 4 is similar to the semiconductor package device 1 shown in FIG. 1A except that in FIG. 4, the lateral surface 143 of the dielectric layer 14 is not coplanar with the lateral surface 123 of the package body 12.

FIGS. 5A, 5B, 5C and 5D illustrate a semiconductor manufacturing method in accordance with some embodiments of the present disclosure.

Figure 5A:
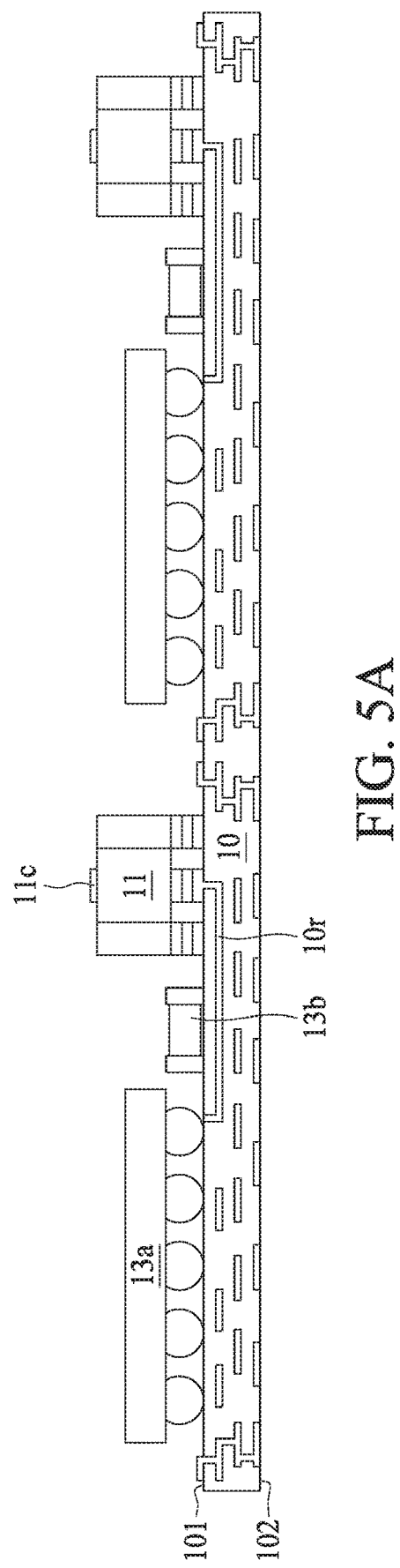
FIG. 5A, FIG. 5B, FIG. 5C and FIG. 5D illustrate a semiconductor manufacturing method in accordance with some embodiments of the present disclosure.

Referring to FIG. 5A, a substrate strip including multiple (or a plurality of) substrates 10 is provided, and the provision of the multiple substrates 10 allows multiple semiconductor package devices to be manufactured concurrently. The substrate 10 may be, for example, a printed circuit board, such as a paper-based copper foil laminate, a composite copper foil laminate, or a polymer-impregnated glass-fiber-based copper foil laminate. The substrate 10 may include an interconnection structure 10r, such as an RDL or the grounding element 10g. In some embodiments, the grounding element 10g is a via to be subsequently exposed from a lateral surface of the substrate 10.

Electronic components 13a, 13b are formed or disposed on the surface 101 of the substrate 10. The electronic component 13a may be an active electronic component, such as an IC or a die. The electronic component 13b may be a passive electronic component, such as a capacitor, a resistor or an inductor. Each electronic component 13a, 13b may be electrically connected to one or more other electronic components and to the substrate 10 (e.g., to the RDL), and electrical connection may be attained by way of flip-chip or wire-bond techniques.

A waveguide component 11 is formed or disposed on the surface 101 of the substrate 10. The waveguide component 11 is electrically connected to the electronic component 13a through the interconnection structure 10r to receive signals from the electronic component 13a or to transmit signals to the electronic component 13a. In some embodiments, the waveguide component 11 may be the waveguide component 11 shown in FIGS. 1B and 1C or the waveguide component 11' shown in FIG. 1D, or any other suitable waveguide component in which a coupling element is formed or disposed on its top surface.

Figure 5B:
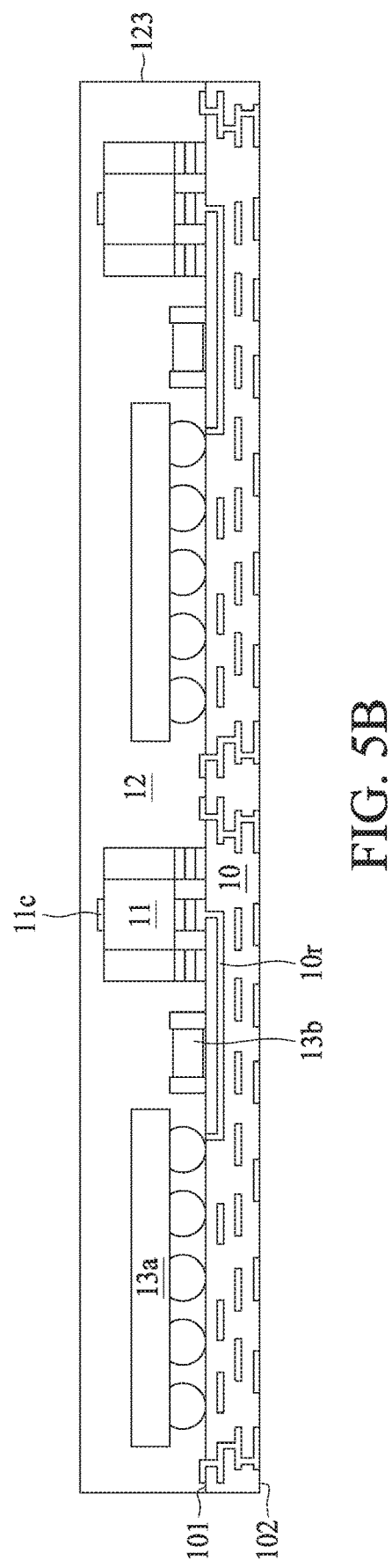

Referring to FIG. 5B, a package body 12 is formed or disposed on the top surface 101 of the substrate 10 and encapsulates a part of the top surface 101 of the substrate 10, the electronic components 13a, 13b and the waveguide component 11. In some embodiments, the package body 12 includes an epoxy resin including fillers dispersed therein. The package body 12 may be formed or disposed by a molding technique, such as transfer molding or compression molding.

Figure 5C:
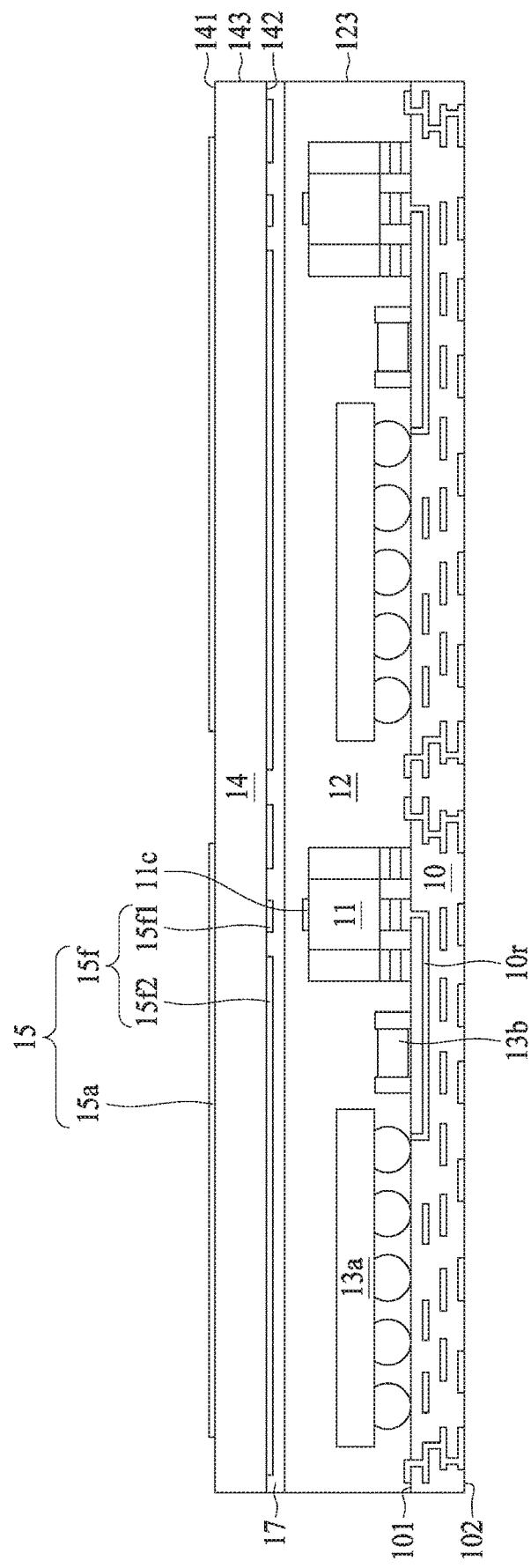

Referring to FIG. 5C, a dielectric layer 14 is attached to the package body 12 through the adhesive layer 17. The dielectric layer 14 may include, but is not limited to, molding compounds or pre-impregnated composite fibers (e.g., pre-preg). Examples of molding compounds may include, but are not limited to, an epoxy resin including fillers dispersed therein. Examples of a pre-preg may include, but are not limited to, a multi-layer structure formed by stacking or laminating a number (or plurality) of pre-impregnated materials and/or sheets.

The dielectric layer 14 includes an antenna pattern 15a on its top surface 141 and a feeding layer 15f on its bottom surface 142. The antenna pattern 15a and the feeding layer 15f are, or include, a conductive material such as a metal or metal alloy. Examples of the conductive material include Au, Ag, Al, Cu, or an alloy thereof. The portion 15f1 of the feeding layer 15f is disposed to correspond to or align with the coupling element 11c of the waveguide component 11.

Figure 5D:
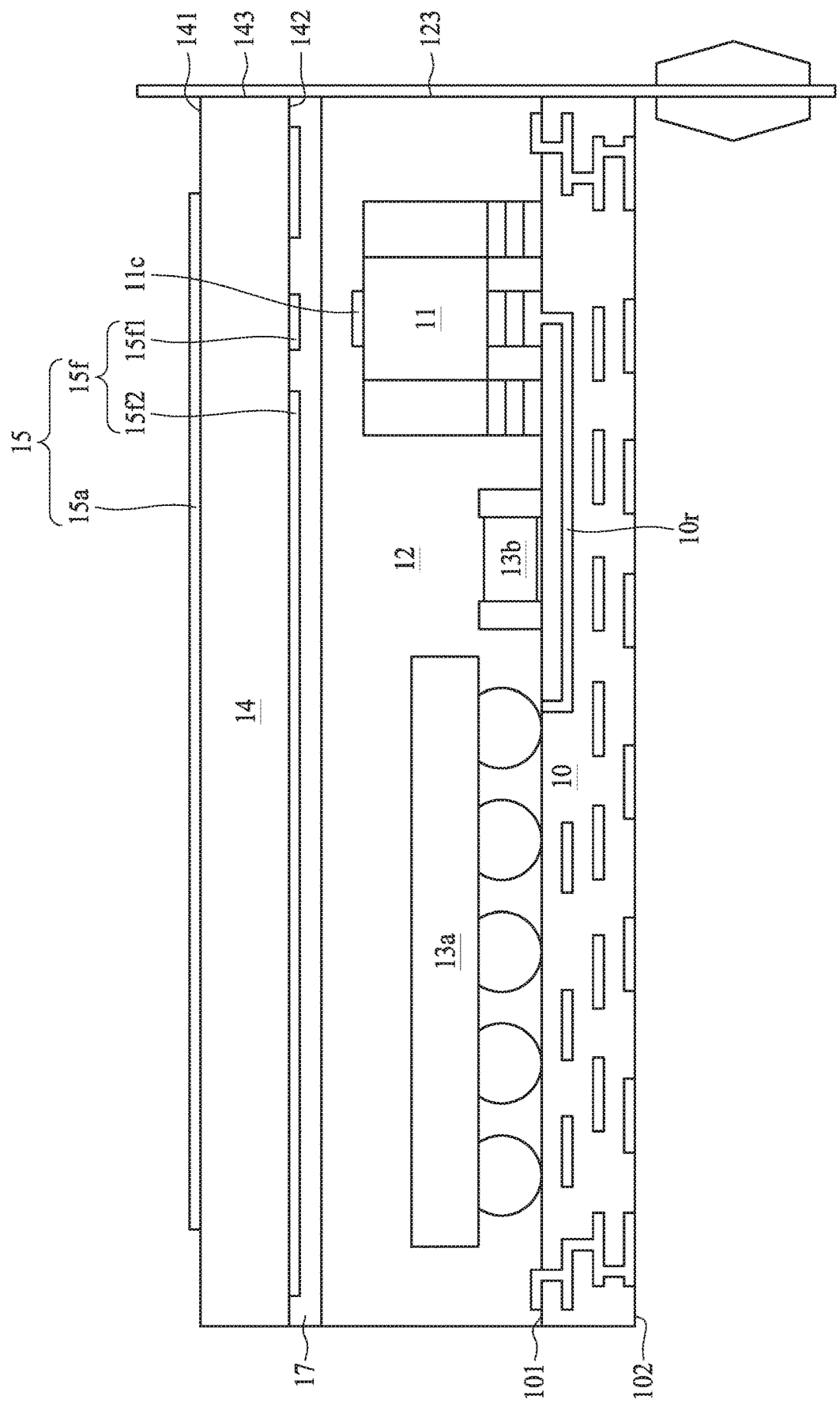

Referring to FIG. 5D, singulation may be performed to separate out individual semiconductor package devices 1 as shown in FIG. 1. For example, the singulation is performed through the dielectric layer 14, the package body 12 and the substrate strip including the substrates 10. The singulation may be performed, for example, by using a dicing saw, laser or other suitable cutting technique.

Figure 6A:
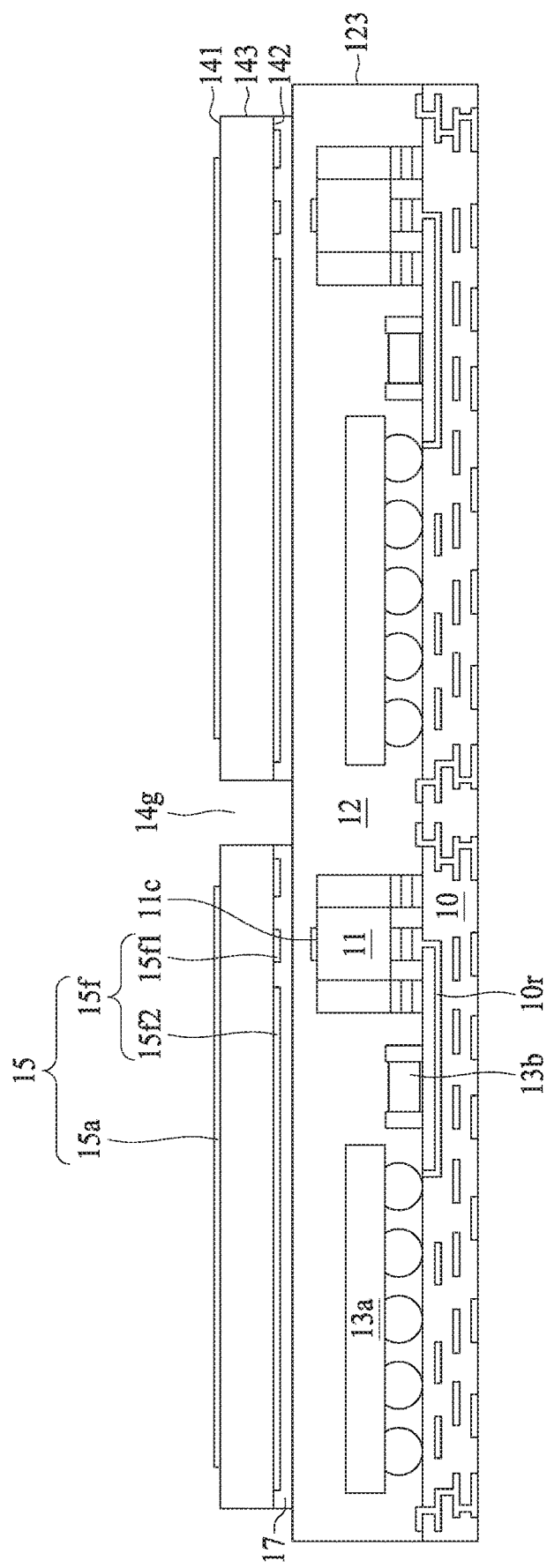
FIG. 6A and FIG. 6B illustrate a semiconductor manufacturing method in accordance with some embodiments of the present disclosure.
Figure 6B:
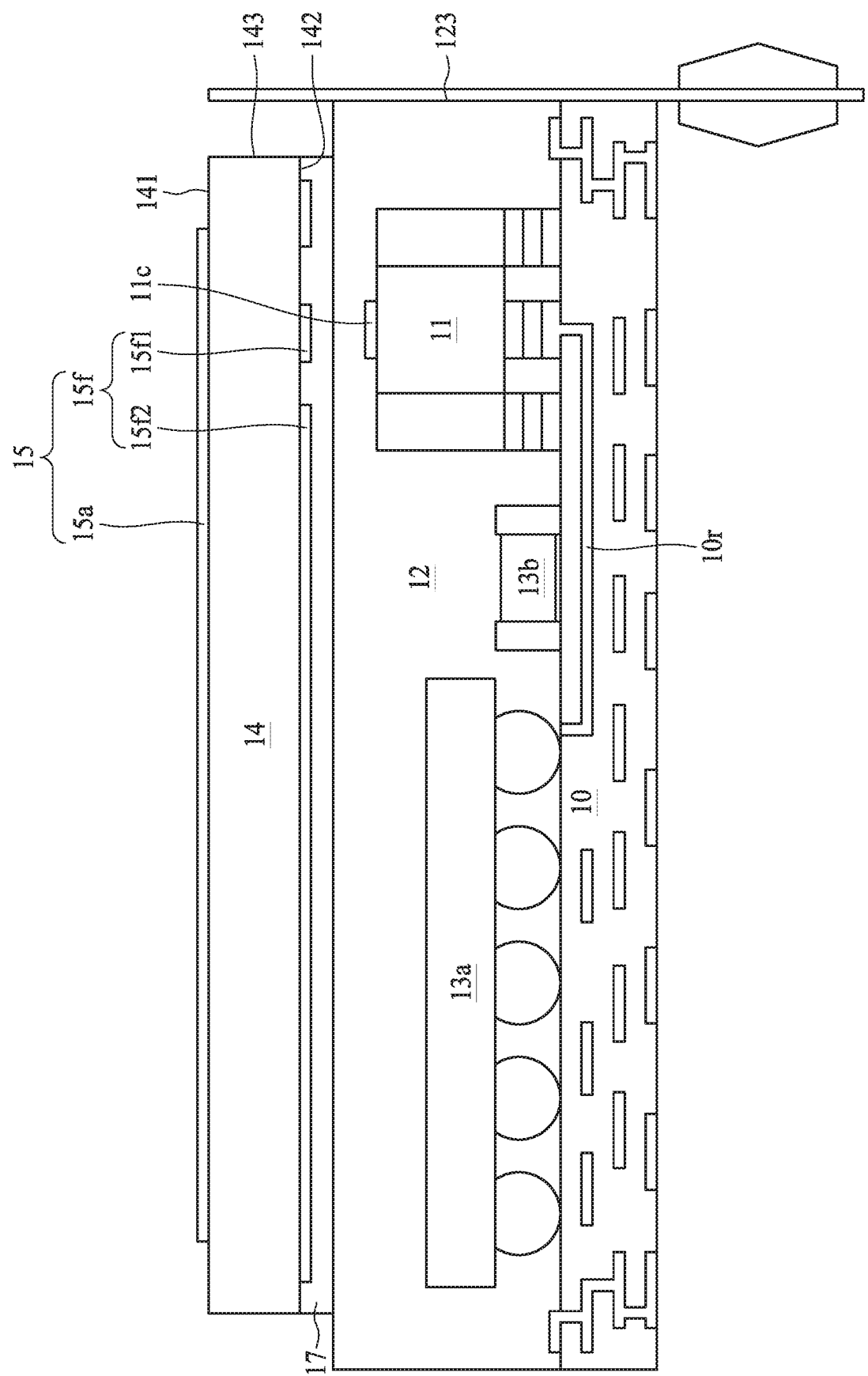

In some embodiments, after the singulation operation, a shielding layer 36 can be formed or disposed on a lateral surface 103 of the substrate 10, a lateral surface 123 of the package body 12 and a lateral surface 143 of the dielectric layer 14 to form the semiconductor package device 3 as shown in FIG. 3. The shielding layer 36 is electrically connected to the grounding element 10g of the substrate 10. In some embodiments, the shielding layer 36 directly contacts the grounding element 10g of the substrate 10. The shielding layer 36 is aligned with a bottom surface 102 of the substrate 10; for example, a bottom of the shielding layer 36 is substantially coplanar with the bottom surface 102 of the substrate 10. In some embodiments, the shielding layer 36 is a conductive thin film, and may include, for example, Al, Cu, Cr, Sn, Au, Ag, Ni or stainless steel, or a mixture, an alloy, or other combination thereof. The shielding layer 36 may include a single conductive layer or multiple (or a plurality of) conductive layers. In some embodiments, the shielding layer 36 includes multiple conductive layers, and the multiple conductive layers may include a same material, or ones of the multiple conductive layers may include different materials, or each of the multiple conductive layers may include different materials from others of the multiple conductive layers. In some embodiments, each conductive layer of the shielding layer 36 has a thickness of up to about 200 μm, such as up to about 150 μm, up to about 100 μm, up to about 50 μm, up to about 10 μm, up to about 5 μm, up to about 1 μm, or up to about 500 nm, and down to about 100 nm or less, down to about 50 nm or less, or down to about 10 nm or less. In some embodiments, the shielding layer 36 includes multiple conductive layers, and different conductive layers may have different thicknesses FIGS. 6A and 6B illustrate a semiconductor manufacturing method in accordance with some embodiments of the present disclosure. The operation shown in FIG. 6A is performed subsequent to the operation shown in FIG. 5B.

Referring to FIG. 6A, individual dielectric layers 14 are attached to the package body 12 through the adhesive layer 17. Each dielectric layer 14 is physically separated from an adjacent dielectric layer. For example, there is a gap 14g between any of two adjacent dielectric layers 14. The dielectric layer 14 may include, but is not limited to, molding compounds or pre-impregnated composite fibers (e.g., pre-preg). Examples of molding compounds may include, but are not limited to, an epoxy resin including fillers dispersed therein. Examples of a pre-preg may include, but are not limited to, a multi-layer structure formed by stacking or laminating a number (or plurality) of pre-impregnated materials and/or sheets.

Each dielectric layer 14 includes an antenna pattern 15a on its top surface 141 and a feeding layer 15f on its bottom surface 142. The antenna pattern 15a and the feeding layer 15f are, or include, a conductive material such as a metal or metal alloy. Examples of the conductive material include Au, Ag, Al, Cu, or an alloy thereof. The portion 15f1 of the feeding layer 15f is disposed to correspond to or align with the coupling element 11c of the waveguide component 11.

Referring to FIG. 6B, singulation may be performed to separate out individual semiconductor package devices 4 as shown in FIG. 4. For example, the singulation is performed through the dielectric layer 14, the package body 12 and the substrate strip including the substrates 10. The singulation may be performed, for example, by using a dicing saw, laser or other suitable cutting technique.

Figure 7A:
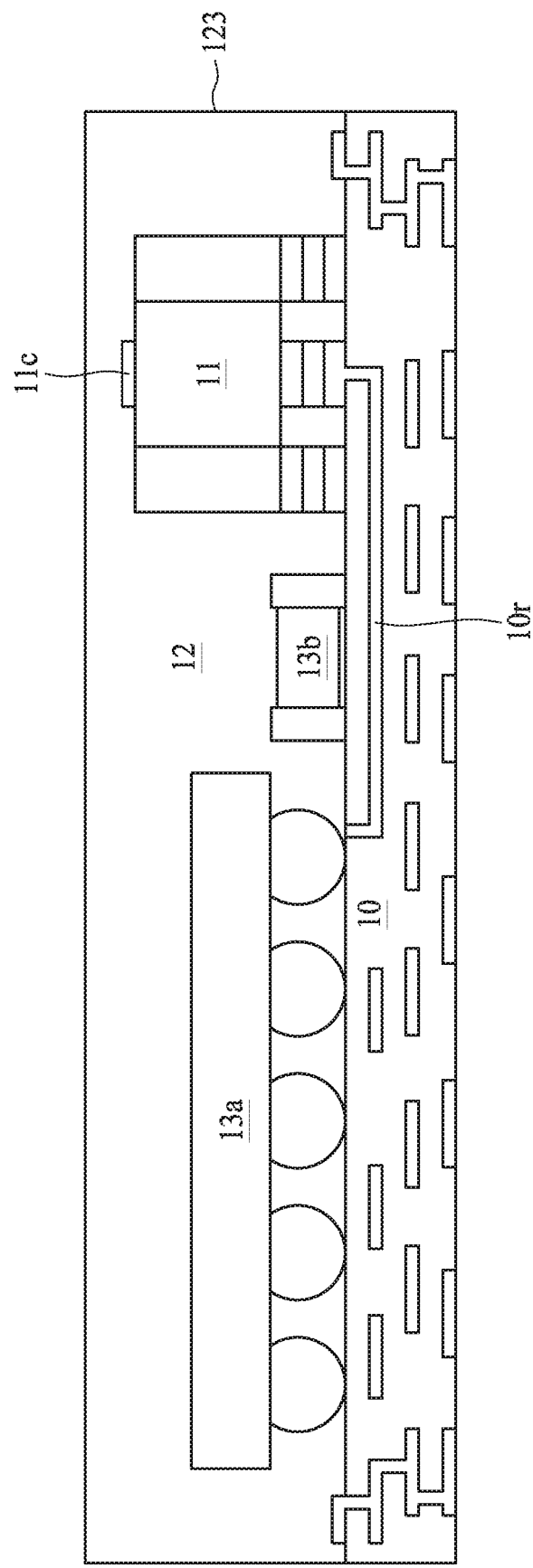
FIG. 7A and FIG. 7B illustrate a semiconductor manufacturing method in accordance with some embodiments of the present disclosure.
Figure 7B:
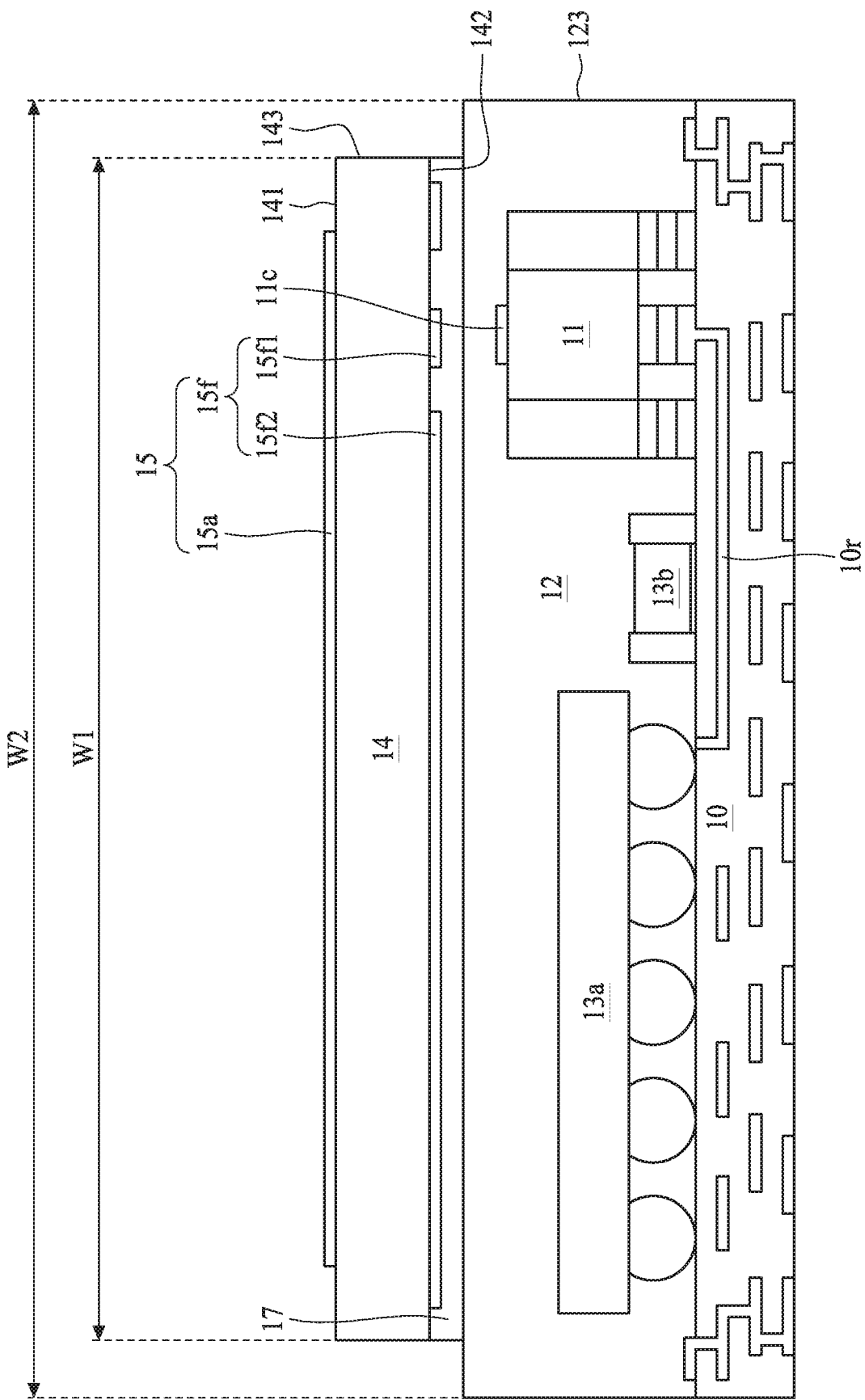

FIGS. 7A and 7B illustrate a semiconductor manufacturing method in accordance with some embodiments of the present disclosure. The operation shown in FIG. 7A is performed subsequent to the operation shown in FIG. 5B.

Referring to FIG. 7A, singulation may be performed to separate out individual semiconductor package devices. For example, the singulation is performed through the package body 12 and the substrate strip including the substrates 10. The singulation may be performed, for example, by using a dicing saw, laser or other suitable cutting technique.

Referring to FIG. 7B, a dielectric layer 14 is attached to the package body 12 through the adhesive layer 17 to form the semiconductor package device as shown in FIG. 4. The lateral surface 143 of the dielectric layer 14 is not coplanar with the lateral surface 123 of the package body 12. For example, a width W1 of the dielectric layer 14 is less than a width W2 of the package body 12. The dielectric layer 14 may include, but is not limited to, molding compounds or pre-impregnated composite fibers (e.g., pre-preg). Examples of molding compounds may include, but are not limited to, an epoxy resin including fillers dispersed therein. Examples of a pre-preg may include, but are not limited to, a multi-layer structure formed by stacking or laminating a number (or plurality) of pre-impregnated materials and/or sheets.

Each dielectric layer 14 includes an antenna pattern 15a on its top surface 141 and a feeding layer 15f on its bottom surface 142. The antenna pattern 15a and the feeding layer 15f are, or include, a conductive material such as a metal or metal alloy. Examples of the conductive material include Au, Ag, Al, Cu, or an alloy thereof. The portion 15f1 of the feeding layer 15f is disposed to correspond to or align with the coupling element 11c of the waveguide component 11.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
    a substrate;
    a waveguide component on the substrate, comprising:
        a first dielectric block having a top surface, a bottom surface opposite to the top surface and a lateral surface extending between the top surface and the bottom surface;
        a coupling element on the top surface of the first dielectric block;
        a first conductive contact on the bottom surface of the first dielectric block and located corresponding to the coupling element;
        a metal plate surrounding the lateral surface of the first dielectric block and connected to the substrate, and
        a second dielectric block disposed on the top surface of the first dielectric block and the metal plate,
        wherein the coupling element of the waveguide component comprises a second conductive contact, a coupling pattern and a conductive line connecting the second conductive contact with the coupling pattern,
        and wherein the second conductive contact is disposed on the top surface of the first dielectric block, and the coupling pattern is disposed on the second dielectric block and is connected to the second conductive contact through the conductive line;
    a package body on the substrate and encapsulating the waveguide component;
    a first dielectric layer on the package body and having a first surface and a second surface adjacent to the package body and opposite to the first surface;
    an antenna pattern on the first surface of the first dielectric layer;
    an antenna feeding layer on the second surface of the first dielectric layer; and
    an adhesive layer disposed between the package body and the first dielectric layer,
    wherein the antenna feeding layer is in contact with the adhesive layer and the first dielectric layer.

2. The semiconductor package device of claim 1, wherein the waveguide component further comprises a second dielectric layer surrounding the metal plate.

3. The semiconductor package device of claim 1, wherein the second conductive contact, the coupling pattern and the conductive line are disposed on the top surface of the first dielectric block.

4. The semiconductor package device of claim 1, further comprising:
    an electrical connection within the substrate; and
    an electronic component disposed on the substrate and electrically connected to the first conductive contact of the waveguide component through the electrical connection within the substrate.

5. The semiconductor package device of claim 1, further comprising:
    a trace on the substrate; and
    an electronic component disposed on the substrate and electrically connected to the first conductive contact of the waveguide component through the trace on the substrate.

6. The semiconductor package device of claim 1, wherein the antenna feeding layer comprises:
    a first portion disposed corresponding to the coupling element; and
    a second portion spaced from the first portion,
    wherein the second portion surrounds a first lateral surface and a second lateral surface of the first portion, and the first portion is arranged to couple to the coupling element and the antenna pattern.

7. The semiconductor package device of claim 6, wherein the first portion of the antenna feeding layer is spaced from the antenna pattern and is wirelessly and electrically coupled to the antenna pattern.

8. The semiconductor package device of claim 6, wherein the first portion of the antenna feeding layer is electrically connected with the antenna pattern through an electrical connection within the first dielectric layer.

9. The semiconductor package device of claim 6, further comprising:
    a grounding element in the substrate; and
    a shielding layer disposed on a lateral surface of the package body and a lateral surface of the substrate, wherein the shielding layer is connected to the grounding element.

10. The semiconductor package device of claim 1, wherein a lateral surface of the package body is substantially coplanar with a lateral surface of the first dielectric layer.

11. The semiconductor package device of claim 1, wherein a lateral surface of the package body and a lateral surface of the first dielectric layer are not coplanar.

12. The semiconductor package device of claim 1, wherein the adhesive layer directly contacts the antenna feeding layer and the package body.

13. The semiconductor package device of claim 1, wherein the waveguide component spaces apart from the antenna feeding layer by the adhesive layer and the package body.

14. The semiconductor package device of claim 1, wherein a lateral surface of the adhesive layer is not coplanar with a lateral surface of the package body.

15. A semiconductor package device, comprising:
a substrate;
a waveguide component disposed on the substrate, the waveguide component comprising:
- a first dielectric block having a top surface, a bottom surface opposite to the top surface and a lateral surface extending between the top surface and the bottom surface;
- a coupling element disposed on the top surface of the first dielectric block;
- a first conductive contact on the bottom surface of the first dielectric block and located corresponding to the coupling element;
- a metal plate surrounding the lateral surface of the first dielectric block and connected to the substrate, and
- a second dielectric block disposed on the top surface of the first dielectric block and the metal plate;
wherein the coupling element further comprises a second conductive contact, a coupling pattern and a conductive line connecting the second conductive contact with the coupling pattern,
and wherein the second conductive contact is disposed on the top surface of the first dielectric block, and the coupling pattern is disposed on the second dielectric block and is connected to the second conductive contact through the conductive line,
a package body disposed on the substrate and encapsulating the waveguide component; and
an antenna layer including an antenna feeding layer disposed on the package body, the antenna feeding layer including a first portion and a second portion spaced from the first portion and surrounding a first lateral surface and a second lateral surface of the first portion,
wherein the first portion of the antenna feeding layer is arranged to couple to the coupling element.

16. The semiconductor package device of claim 15, wherein the antenna layer further comprises:
a dielectric layer having a first surface facing away from the package body and a second surface facing the package body; and
an antenna pattern disposed on the first surface of the dielectric layer,
wherein the antenna feeding layer is disposed on the second surface of the dielectric layer.

17. The semiconductor package device of claim 15, further comprising an adhesive layer disposed between the package body and the antenna feeding layer, wherein the antenna feeding layer is attached to the package body via the adhesive layer.

18. The semiconductor package device of claim 15, further comprising a dielectric layer surrounding the metal plate.

19. The semiconductor package device of claim 15, wherein the second conductive contact, the coupling pattern and the conductive line are disposed on the top surface of the first dielectric block.

* * * * *